(12) United States Patent
Endoh (10) Patent No.: US 9,975,291 B2
(45) Date of Patent: May 22, 2018

(54) NANOSTRUCTURE AND METHOD OF MANUFACTURING THE SAME

(71) Applicant: DEXERIALS CORPORATION, Tokyo (JP)

(72) Inventor: Sohmei Endoh, Utsunomiya (JP)

(73) Assignee: DEXERIALS CORPORATION, Tokyo (JP)

( * ) Notice: Subject to any disclaimer, the term of this patent is extended or adjusted under 35 U.S.C. 154(b) by 174 days.

(21) Appl. No.: 14/441,866

(22) PCT Filed: Dec. 19, 2013

(86) PCT No.: PCT/JP2013/084060
§ 371 (c)(1),
(2) Date: May 11, 2015

(87) PCT Pub. No.: WO2014/103868
PCT Pub. Date: Jul. 3, 2014

(65) Prior Publication Data
US 2015/0306811 A1    Oct. 29, 2015

(30) Foreign Application Priority Data

Dec. 27, 2012    (JP) ................................ 2012-285976

(51) Int. Cl.
*B29C 59/02*    (2006.01)
*B29C 33/38*    (2006.01)
(Continued)

(52) U.S. Cl.
CPC ............ *B29C 59/022* (2013.01); *B29C 33/38* (2013.01); *B29C 33/3842* (2013.01);
(Continued)

(58) Field of Classification Search
CPC . B29C 59/022; B29C 33/3842; B29C 43/021; B29C 59/04; B29C 2059/023;
(Continued)

(56) References Cited

U.S. PATENT DOCUMENTS 7,718,326 B2 *   5/2010   Stenger ............... G03F 7/70408
                                                    430/22
2003/0214083 A1 *  11/2003  Kelly ................. B23K 26/0823
                                                    264/571
(Continued)

FOREIGN PATENT DOCUMENTS

CN      102441989 A    5/2012
JP      2008-229869 A  10/2008
(Continued)

OTHER PUBLICATIONS

Dec. 15, 2016 Office Action issued in Chinese Patent Application No. 201380068572.7.
(Continued)

*Primary Examiner* — Alison L Hindenlang
*Assistant Examiner* — Jerzi H Moreno Hernandez
(74) *Attorney, Agent, or Firm* — Oliff PLC (57) ABSTRACT

A nanostructure that is visually recognized as being seamless by its more regularly and more uniformly formed fine concave-convex structure and that exhibits an excellent antireflection effect against light in a visible wavelength range is provided. Such a nanostructure is configured by a number of rows of tracks each including structures, formed by protrusions or depressions on a surface of a substrate, arranged at a predetermined fine pitch. In this nanostructure, a distance between centers of the structures adjacent to each other across a strip-shaped portion (seam) in which portions with no structures within the predetermined pitch are con- (Continued)

tinuously formed in a track arrangement direction is adjusted so as to prevent visual recognition of the seam.

2 Claims, 5 Drawing Sheets (51) Int. Cl.
| | |
|---|---|
| *B29C 43/02* | (2006.01) |
| *G03F 7/20* | (2006.01) |
| *G03F 7/32* | (2006.01) |
| *B29C 59/04* | (2006.01) |
| *G02B 1/118* | (2015.01) |
| *G03F 7/00* | (2006.01) |
| *B82Y 30/00* | (2011.01) |
| *B82Y 40/00* | (2011.01) |

(52) U.S. Cl.
CPC ............ *B29C 43/021* (2013.01); *B29C 59/04* (2013.01); *G02B 1/118* (2013.01); *G03F 7/0002* (2013.01); *G03F 7/20* (2013.01); *G03F 7/2053* (2013.01); *G03F 7/32* (2013.01); *G03F 7/70383* (2013.01); *B29C 2059/023* (2013.01); *B29K 2833/04* (2013.01); *B82Y 30/00* (2013.01); *B82Y 40/00* (2013.01)

(58) Field of Classification Search
CPC ....... B82Y 30/00; B82Y 40/00; G03F 7/2053; G03F 7/32; G03F 7/0002; G02B 1/118; B29K 2833/04
See application file for complete search history.

(56) References Cited

U.S. PATENT DOCUMENTS

| | | | | |
|---|---|---|---|---|
| 2007/0159698 A1* | 7/2007 | Taguchi | ................ | G02B 1/118 359/586 |
| 2008/0106001 A1* | 5/2008 | Slafer | ................... | B29C 33/30 264/310 |
| 2008/0259457 A1* | 10/2008 | Someya | ................ | G02B 1/118 359/572 |
| 2008/0304155 A1* | 12/2008 | Endoh | ................... | G02B 1/118 359/558 |
| 2009/0194914 A1* | 8/2009 | Uozu | ..................... | B29C 33/38 264/496 |
| 2010/0173113 A1* | 7/2010 | Ermochkine | ........ | B29C 43/003 428/58 |
| 2011/0005412 A1* | 1/2011 | Fujii | ...................... | B29C 59/04 101/216 |
| 2011/0027408 A1 | 2/2011 | Suzuki et al. | | |
| 2011/0249338 A1* | 10/2011 | Endoh | ................... | G02B 1/118 359/601 |
| 2012/0070623 A1 | 3/2012 | Hayashibe et al. | | |
| 2012/0097434 A1* | 4/2012 | Kajiya | ............... | G02F 1/13439 174/255 |
| 2012/0100346 A1* | 4/2012 | Tazawa | ................. | G02B 1/118 428/161 |
| 2012/0147472 A1* | 6/2012 | Kajiya | ..................... | B32B 3/30 359/601 |
| 2013/0161869 A1* | 6/2013 | Yamamoto | .......... | G03F 7/0002 264/293 |
| 2014/0217449 A1* | 8/2014 | Yamaguchi | .......... | G03F 7/0002 257/98 |

FOREIGN PATENT DOCUMENTS

| | | |
|---|---|---|
| JP | 4469385 B2 | 5/2010 |
| JP | 2010-269528 A | 12/2010 |
| JP | 2012-086515 A | 5/2012 |
| JP | 2013-000961 A | 1/2013 |
| WO | 2009/093700 A1 | 7/2009 |

OTHER PUBLICATIONS

Jun. 14, 2016 Office Action issued in Japanese Patent Application No. 2012-285976.
Apr. 8, 2014 International Search Report issued in PCT/JP2013/084060.
Apr. 8, 2016 Office Action issued in Chinese Patent Application No. 201380068572.7.
Jun. 8, 2017 Office Action issued in Chinese Patent Application No. 201380068572.7.

\* cited by examiner

TYPE A

FIG. 5B

TYPE B

FIG. 5C

TYPE C

FIG. 5D

TYPE D

NANOSTRUCTURE AND METHOD OF MANUFACTURING THE SAME

TECHNICAL FIELD

The present invention relates to a nanostructure and a method of manufacturing the nanostructure.

BACKGROUND ART

A moth-eye structure, which exhibits an excellent antireflection effect against light in a visible wavelength range by surface concavities and convexities provided at a fine pitch smaller than or equal to a visible wavelength, has been known and expected to be used in various antireflection films, for example.

Regarding methods of manufacturing moth-eye structures, a method capable of seamlessly producing a moth-eye structure having a large area has been needed. In this regard, a method including: manufacturing a stamper cylinder as a seamless cylinder by joining together a plurality of stamper sheets, each having a fine concave-convex pattern formed thereon, adhering the joined stamper sheet to the inner peripheral surface of a cylinder, and forming a plating layer on the stamper sheet; transferring surface concavities and convexities on the stamper cylinder to a resist layer on a transferred substrate; and processing the transferred substrate with the resist layer used as a mask has been known (Patent Literature 1).

CITATION LIST

Patent Literature

Patent Literature 1: Japanese Patent No. 4469385

SUMMARY OF INVENTION

Technical Problem

According to the method described in Patent Literature 1, however, no plating layer is formed in the area of a plating masking tape for joining the stamper sheets together. This prevents the stamper cylinder from being manufactured completely seamlessly.

In contrast to such a conventional technique, it is an object of the present invention to provide a nanostructure that is visually recognized as being seamless as a result of its more regularly and more uniformly formed fine concave-convex structure.

Solution to Problem

To solve the above-described problem, the present invention provides a nanostructure including a number of rows of tracks, each including arrangement of structures formed by protrusions or depressions on a surface of a substrate with a predetermined pitch. In this nanostructure, a distance between centers of the structures adjacent to each other across a strip-shaped portion (hereinafter referred to as a seam) in which portions with no structures within the predetermined pitch are continuously formed in a track arrangement direction or a length of the seam is determined so as to prevent visual recognition of the seam.

Moreover, the present invention provides a nanostructure master used for manufacturing a nanostructure. The nanostructure master includes surface concavities and convexities, and transferring the surface concavities and convexities on the nanostructure master to a resin material produces surface concavities and convexities in the nanostructure.

Furthermore, the present invention provides a method of manufacturing the above-described nanostructure, including the steps of:

forming a resist layer on a surface of a master;

pulse-irradiating the resist layer on the master with laser light while moving its irradiation position to form a latent image pattern in which a number of rows of latent image tracks, each including arrangement of spot-like latent images made of exposed portions with a predetermined pitch in an exposure direction, are arranged;

developing the latent images to form a resist pattern;

etching the master with the resist pattern used as a mask to form a concave-convex pattern on the surface of the master; and transferring surface concavities and convexities of the master to a resin material, wherein in the step of forming the latent image pattern, a width of a laser light unirradiated portion provided as a buffer area in a latent image track or a length of a plurality of the laser light unirradiated portions provided as the buffer area, arranged in an arrangement direction of the plurality of latent image tracks, is determined so that no seam is visually recognized in the manufactured nanostructure.

Advantageous Effects of Invention

The nanostructure of the present invention includes a track having structures, which make up the fine concave-convex structure on the surface of the substrate, arranged at a predetermined fine pitch. When a number of such tracks are arranged in rows, the distance between the centers of the structures across the seam is determined so as to prevent the visual recognition of the seam. Therefore, the present invention provides the seamless nanostructure having excellent uniformity in its fine structure.

Moreover, according to the method of manufacturing the nanostructure of the present invention, in the step of manufacturing the master having the surface concavities and convexities, which is used for manufacturing the nanostructure, the resist layer on the master is pulse-irradiated with the laser light to form the latent image pattern in which the spot-like latent images are arranged at the predetermined fine pitch and a number of rows of such arrangement of the spot-like latent images are disposed. Here, the laser light unirradiated portion is set as the buffer area of the latent image track and the width of the laser light unirradiated portion is determined so as to prevent the visual recognition of the seam in the manufactured nanostructure. Or alternatively, the length of the laser light unirradiated portions continuously arranged is determined to a length to prevent the visual recognition of the seam. Thus, the nanostructure having excellent uniformity of its fine structure can be manufactured.

BRIEF DESCRIPTION OF DRAWINGS

A in FIG. 1 is a schematic plan view illustrating a nanostructure according to an embodiment of the present invention; B is a partial enlarged plan view illustrating the nanostructure shown in A; C is a cross-sectional view of tracks T1 and T3 in B; D is a cross-sectional view of tracks T2 and T4 in B; E is a schematic waveform chart illustrating modulated waveform of laser light for forming latent images corresponding to the tracks T1 and T3 in B in manufacturing of a nanostructure master; and F is a schematic waveform chart illustrating modulated waveform of laser light for forming latent images corresponding to the tracks T2 and T4 in B in manufacturing of the nanostructure master.

DESCRIPTION OF EMBODIMENTS

The following present invention will be described in detail with reference to the drawings.

Figure 1:
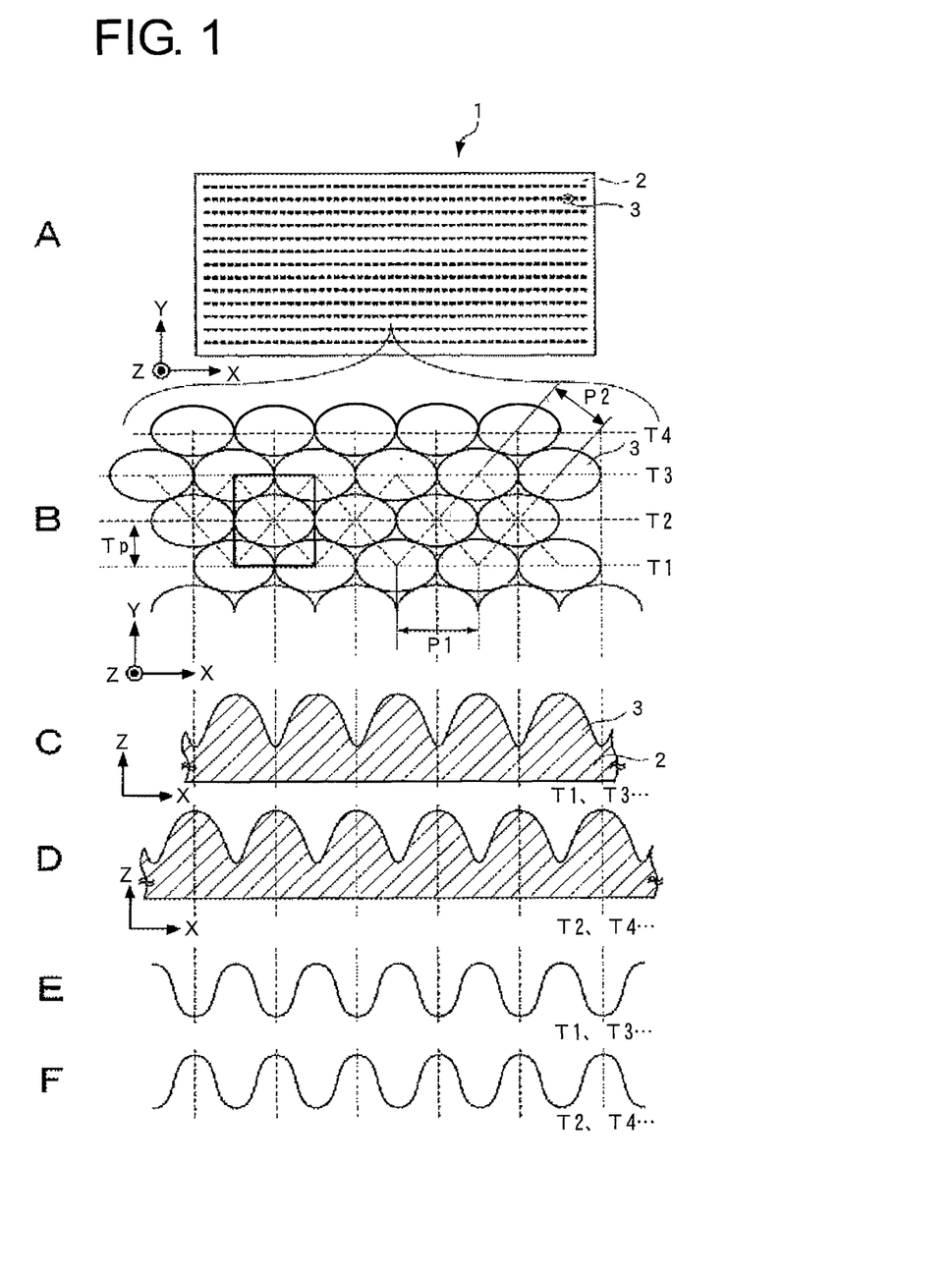

A nanostructure of the present invention includes a number of structures 3, which are protrusions formed on a surface of a substrate 2, arranged at a predetermined fine pitch P1 as in a nanostructure 1 illustrated in FIG. 1 according to one embodiment, for example. More specifically, a number of tracks T1, T2, T3, . . . , each including the structures 3 arranged at the predetermined fine pitch P1, are arranged at a predetermined track pitch Tp.

The size of the fine pitch P1 of the structures 3 can be set, for example, at a visible wavelength or less, more specifically, at about 300 nm or less. The size can be set at 1000 nm or less depending on its intended use.

The substrate 2 is made of a transparent synthetic resin, such as polycarbonate (PC) or polyethylene terephthalate (PET), or glass.

The substrate 2 may be in the form of a film, a sheet, a plate, or a block, for example.

In the nanostructure 1 illustrated in FIG. 1, two adjacent ones of the tracks T1, T2, T3, and T4 have arrangement pitches of the structures 3 shifted from each other by a half cycle. Consequently, the structures 3 in the two adjacent ones of the tracks T1, T2, T3, and T4 are arranged in a staggered manner and the arrangement pattern of the structures 3 thus has a quasi-hexagonal lattice pattern as illustrated in B of FIG. 1. Note that the arrangement pattern of the structures in the present invention is not limited to such a quasi-hexagonal lattice. The arrangement pattern may be a regular hexagonal lattice, a regular tetragonal lattice, or a quasi-tetragonal lattice. The quasi-hexagonal lattice as used herein refers to a distorted pattern obtained by stretching a regular hexagonal lattice in an extending direction of the tracks T1, T2, T3, and T4 (an x-direction in FIG. 1). The quasi-tetragonal lattice as used herein refers to a distorted pattern obtained by stretching a regular tetragonal lattice in the extending direction of the tracks T1, T2, T3, and T4 (the x-direction in FIG. 1).

As described above, the structures 3 are arranged in each of the tracks T1, T2, T3, and T4 at the predetermined pitch P1 smaller than or equal to a visible wavelength. However, as will be explained in a manufacturing method of the present invention to be described later, the tracks T1, T2, T3, and T4 each also include a portion in which a distance between the centers of the structures 3 is different from the predetermined pitch P1, i.e., a portion having no structures 3 within the predetermined pitch P1 (hereinafter referred to also as a structure absent portion) by the adjustment of a buffer area (hereinafter referred to as a BA) for laser light pulse irradiation. When such structure absent portions are arranged across a plurality of tracks, the resultant continuous strip-shaped seam can be visually recognized as a line depending on the size of such an absent portion.

In this regard, the nanostructure 1 of the present invention sets the distance between the centers of the structures 3 adjacent to each other in the structure absent portion so as not to be excessively large in order to prevent the visual recognition of such a seam, while allowing such a center-to-center distance to be greater than the predetermined pitch P1 in the corresponding track. Alternatively, the length of the seam continuously formed across a plurality of tracks is set so as not to be excessively long in order to prevent the visual recognition of such a seam. For example, the distance between the centers of the structures 3 adjacent to each other in the structure absent portion is set to be smaller than or equal to 1.52 times the predetermined pitch P1 in the corresponding track, or the distance between the centers of the structures 3 adjacent to each other in the structure absent portion is set to be greater than 1.52 times the pitch P1 in the corresponding track and the length of the structure absent portions continuously formed in a track arrangement direction is set at 50 μm or less. Note that the track arrangement direction as used herein, along which the structure absent portions are continuously formed, is not limited to a vertical direction, but may be an oblique direction, with respect to the track extending direction.

As described above, the distance between the centers of the structures and the length of the structure absent portions continuously formed, which generate a seam, are controlled in the nanostructure 1 of the present invention. Thus, no seam is visually recognized as a line and the nanostructure 1 of the present invention is therefore a substantially seamless nanostructure.

Note that the shape itself of the individual structure 3 has no particular limitations in the present invention. The structure 3 may have a conical structure having a circular, elliptical, oval, or egg-shaped bottom surface. Alternatively, the bottom surface of the structure 3 may be formed as a circle, an ellipse, an oval, or an egg shape and the top thereof may be formed as a curved surface or a flat surface. Moreover, a minute protrusion may be provided between adjacent ones of the structures 3.

The height of each structure 3 also has no particular limitations. For example, the height may be in a range of about 180 nm to about 420 nm.

The structures 3 can be provided by forming protrusions or depressions on the surface of the substrate 2.

In accordance with the method of the present invention, the above-described nanostructure 1 can be manufactured by carrying out: a step of forming a resist layer on a surface of a master; a step of pulse-irradiating the resist layer on the master with laser light while moving its irradiation position to form a latent image pattern in which a number of rows of latent image tracks, each including arrangement of spot-like latent images made of exposed portions with a predetermined fine pitch in an exposure direction, are arranged; a step of developing the latent images to form a resist pattern; a step of etching the master with the resist pattern used as a mask to form a concave-convex pattern on the surface of the master; and a step of transferring concavities and convexities on the surface of the master to a resin material.

This manufacturing method has its feature in the step of forming the latent image pattern. The other steps, excluding the step of forming the latent image pattern, can be carried out with common procedures. More specifically, the method of manufacturing the nanostructure according to the present invention includes, in the step of forming the latent image pattern, setting a laser light unirradiated portion as the BA in a latent image track and determining the width of the laser light unirradiated portion or the length of the laser light unirradiated portions arranged in an arrangement direction of a plurality of latent image tracks so that no seam can be visually recognized in the manufactured nanostructure.

Figure 2:
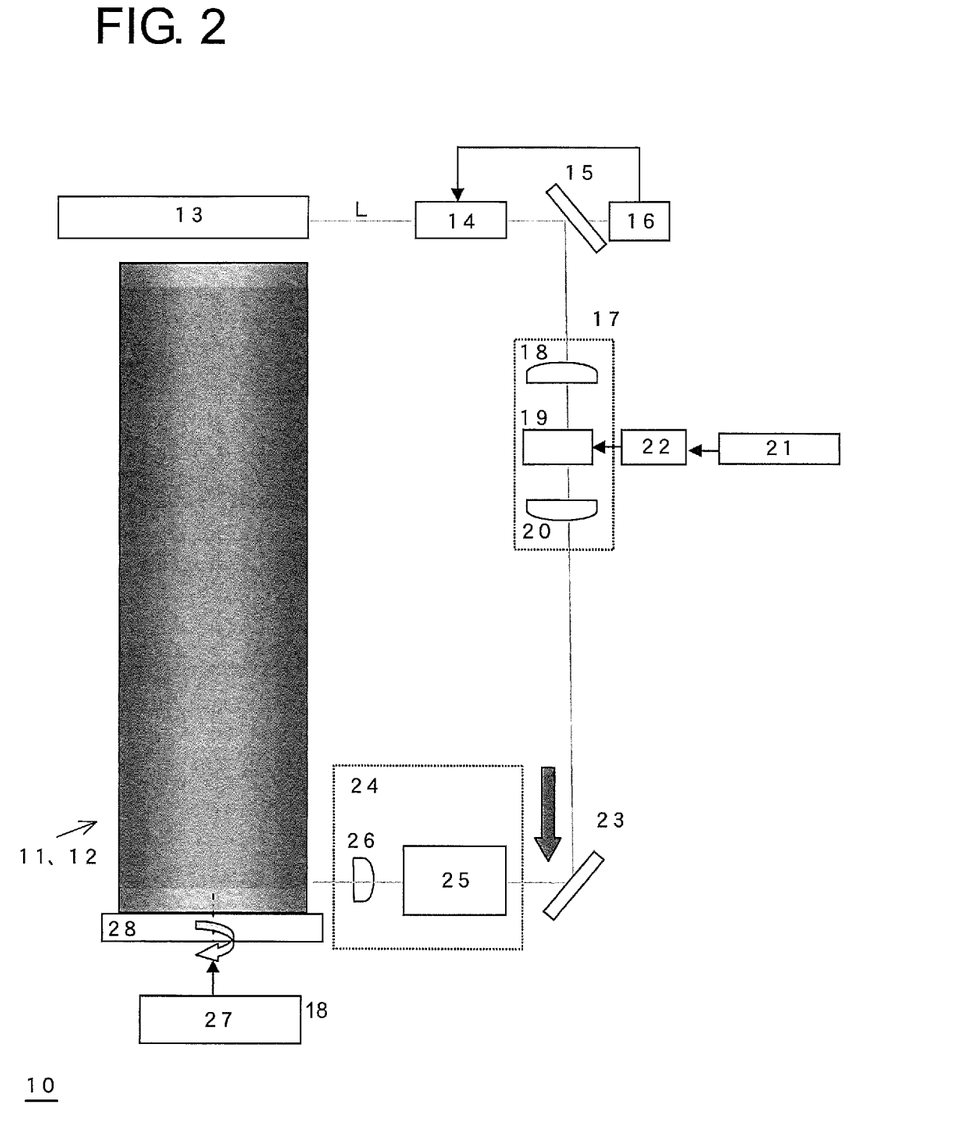
FIG. 2 is a schematic diagram for explaining a roll master exposure apparatus.

FIG. 2 is a schematic diagram for explaining a roll master exposure apparatus 10 suitable for forming such a latent image pattern. The roll master exposure apparatus 10 includes: a laser light source 13 that emits laser light (wavelength: 266 nm) for exposing a resist layer 12 deposited on a surface of a roll master 11; an electro optical modulator (EOM) 14 on which laser light L exited from the laser light source 13 is incident; a mirror 15 constituted by a polarizing beam splitter; and a photodiode 16. A polarized component transmitted through the mirror 15 is received at the photodiode 16. The photodiode 16 controls the electro optical modulator 14 to modulate the phase of the laser light L and thus reduce laser noise.

Additionally, the roll master exposure apparatus 10 includes an optical modulation system (OM) 17 that modulates the intensity of the phase-modulated laser light L. The optical modulation system (OM) 17 includes: a condenser lens 18; an acoustic-optical modulator (AOM) 19; and a lens 20 that produces parallel light. Additionally, the roll master exposure apparatus 10 includes: a formatter 21 that forms a two-dimensional latent image pattern; and a driver 22. The formatter 21 controls irradiation timing of laser light to the resist layer 12. The driver 22 controls the acoustic-optical modulator (AOM) 19.

Figure 3:
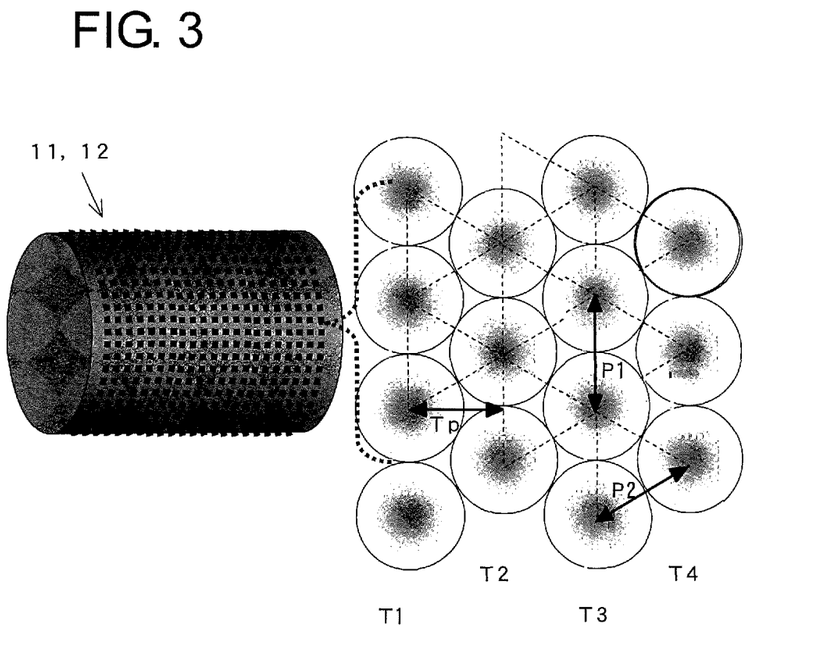
FIG. 3 is a diagram for explaining a pattern formed on a roll master.

More specifically, when forming such a two-dimensional latent image pattern, the formatter 21 generates a polarity reversal formatter signal and a signal for synchronizing a rotation controller of the roll master 11 for every track, and then the acoustic-optical modulator (AOM) 19 performs intensity modulation. Exposure at a constant angular velocity (CAV) and with an appropriate rotation speed, an appropriate modulation frequency, an appropriate pulse duty, and an appropriate feed pitch allows for the formation of latent images with a hexagonal lattice pattern as shown in FIG. 3. The hexagonal lattice pattern in FIG. 3 can be obtained, for example, when a pitch in the circumferential direction of the roll master 11 (i.e., a pitch P1 in the exposure direction) is set at 315 nm, a diagonal pitch P2 in a direction of about 60 degrees (direction of about −60 degrees) with respect to the circumferential direction is set at 300 nm, and a feed pitch Tp is set at 251 nm (the Pythagorean theorem). In this case, the rotation speed of the roll master 11 is kept constant at 450 rpm, 900 rpm, or 1800 rpm, for example. The frequency of the polarity reversal formatter signal to be generated by the formatter 21 is determined according to this rotational speed. Latent images with a quasi-hexagonal lattice, tetragonal lattice, or quasi-tetragonal lattice pattern can be formed in a similar manner.

Figure 4:
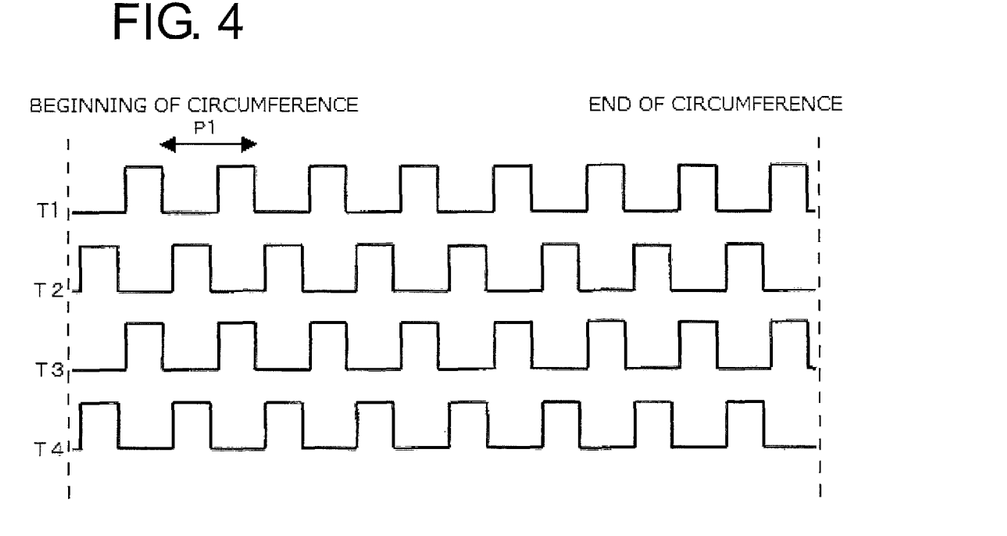
FIG. 4 is a diagram for explaining pulses of laser light for exposing a resist layer on the roll master.
Figure 5A:
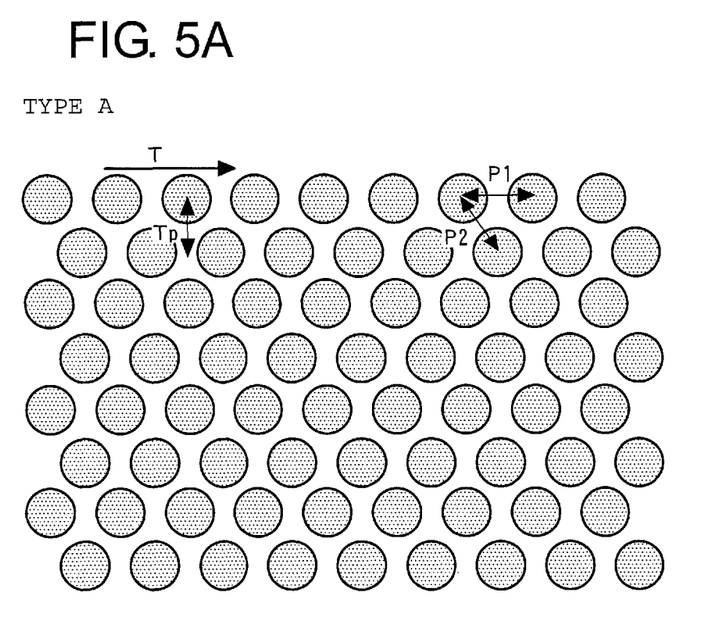
FIG. 5A is a pattern diagram illustrating a latent image pattern.
Figure 5B:
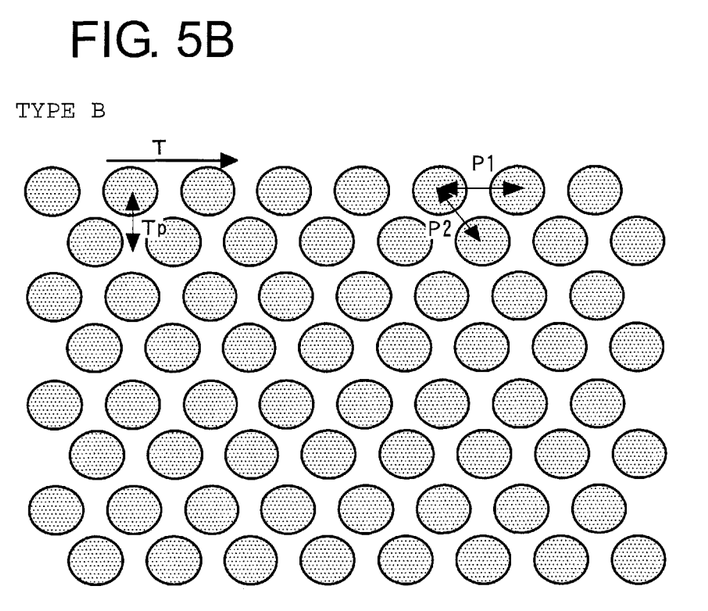
FIG. 5B is a pattern diagram illustrating a latent image pattern.
Figure 5C:
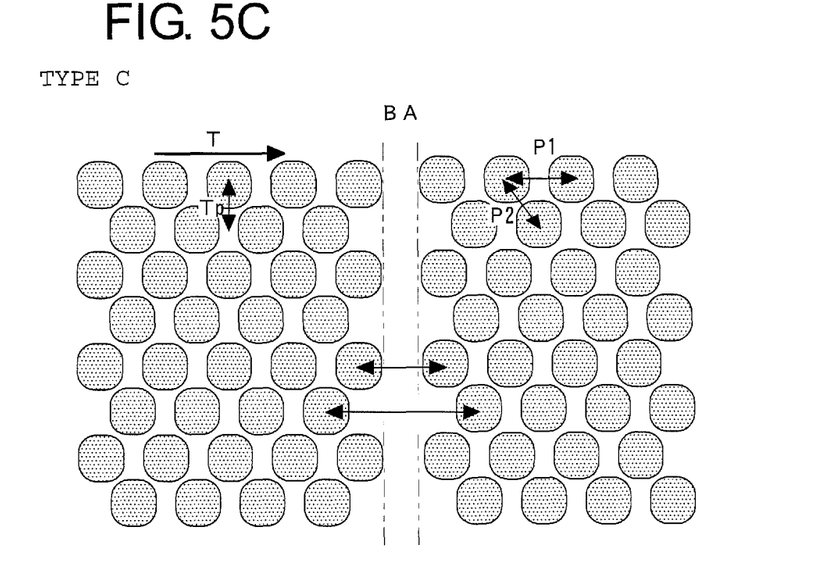
FIG. 5C is a pattern diagram illustrating a latent image pattern.
Figure 5D:
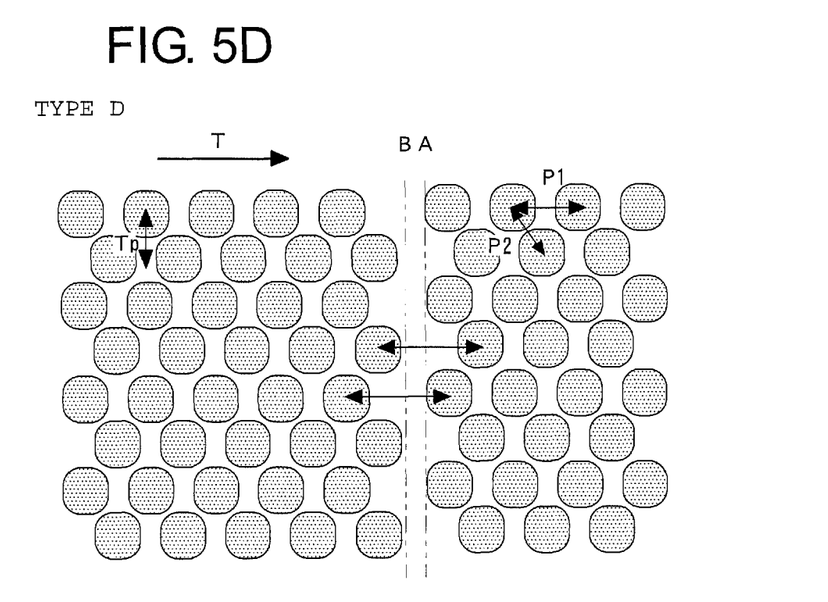
FIG. 5D is a pattern diagram illustrating a latent image pattern.

When the pulse duty is set at less than 50%, the laser light unirradiated portion provided as the BA is set to zero. This allows for polarity-reversed light emission as shown in FIG. 4 and thus a latent image pattern in which spot-like latent images are arranged at the predetermined pitch P1 in the exposure direction (circumferential direction) and the positions of the spot-like latent images are shifted from each other by a half pitch between tracks adjacent to each other can be formed.

The pulse duty as used herein refers to a ratio (%) of irradiation time to a pulse period. When the pulse duty is less than 50%, the laser light unirradiated portion provided as the BA can be set to zero as described above. When the pulse duty is set at 50% or more, in contrast, it is preferable, in the laser light unirradiated portion provided as the BA, that the distance between the centers of a pair of the spot-like latent images interposing such a laser light unirradiated portion therebetween be smaller than or equal to 1.52 times the predetermined pitch P1 of the spot-like latent images. Note that these numerical values have been found out by the present inventor through the study of arrangement patterns of structures and various nanostructures having different pitches of structures.

The BA is a length of the laser light unirradiated portion provided in a latent image track for positional adjustment of spot-like latent images between latent image tracks adjacent to each other. The BA is controlled by the optical modulation system (OM) 17 according to the length of one track (the circumferential length of the roll master 11), the pulse frequency, the pulse duty, and the like. The BA set in each track may be provided continuously in the rotational axis direction of the roll master 11 or provided continuously in a diagonal direction with respect to the rotational axis of the roll master 11.

The thus intensity-modulated laser light is reflected by a mirror 23, shaped into a desired beam shape by a beam expander (BEX) 25 on a movable table 24, and irradiated onto the resist layer 12 on the roll master 11 via an objective lens 26. More specifically, such laser light is expanded to have a five-times-larger beam diameter by the beam expander (BEX) 25 and irradiated onto the resist layer 12 on the roll master 11 via the objective lens 26 having a numerical aperture (NA) of 0.9.

The roll master 11 is placed on a turntable 28 connected to a spindle motor 27. Pulse irradiation with laser light is performed on the resist layer 12 while the roll master 11 is rotated and the laser light is moved in a height direction. The latent images thus formed on the resist layer 12 by the irradiation each have a generally elliptical shape having its long axis in the circumferential direction.

Although the method of forming the latent image pattern on the resist layer 12 with the roll master exposure apparatus 10 has been described above, a latent image pattern may be formed on a disk master by means of exposure in the method of manufacturing the nanostructure according to the present invention.

After the formation of the latent image pattern, the resist layer 12 is developed by dissolving the exposed portions of the resist to form a resist pattern.

Next, the master is etched with the resist pattern used as a mask to form a concave-convex pattern on the surface of the master. Such patterning is done by plasma etching of a glass master in a $CHF_3$ gas atmosphere, for example.

In this etching, etching proceeds only in areas where the surface of the master is exposed, and no etching proceeds in an area having the resist since the resist serves as a mask. This yields the master with the surface having the fine concave-convex pattern.

The master with the surface having the fine concave-convex pattern formed thereon is made close contact with a resin material such as an acrylic sheet. The resin material is then cured by ultraviolet irradiation, for example. Peeling off of the resin material yields a nanostructure to which the fine concave-convex pattern on the surface of the master has been transferred. Here, if a roll master is employed as a master, a moth-eye structure sheet in which no seam is visually recognized over a large area can be produced by a roll-to-roll method.

The nanostructure of the present invention can preferably be used in various optical devices such as displays, optical electronics, optical communications (optical fibers), solar cells, and lighting apparatuses to obtain a function achieved by a moth-eye structure. More specifically, the nanostructure of the present invention allows a clear image to be produced by preventing glare due to external light by its antireflection effect or allows quality of interior decorations such as lighting to be enhanced, for example. Moreover, the nanostructure of the present invention can be used not only for a moth-eye structure but also for a structure in which a nanostructure has cyclic nature (pitch).

EXAMPLES

The present invention will now be described below with more specific examples.

Examples 1 to 4, and Comparative Examples 1 and 2

The roll master 11 of the roll master exposure apparatus 10 illustrated in FIG. 2 was used and a chemically-amplified resist was used. Exposure conditions were varied as shown in Table 1 to form latent image patterns of types A, B, C, and D illustrated in FIGS. 5A to 5D.

Note that T in these figures represents the exposure direction.

In the latent image pattern of Comparative Examples 1 and 2 (FIG. 5C), the distance between the centers of latent images across the BA is longer than the exposure direction pitch P1 every other track. Table 1 describes this distance between the centers of the latent images which is longer than P1.

The resist layer having the latent image pattern formed thereon was developed and etched to produce a roll master with a surface having minute concavities and convexities. The minute concavities and convexities on the surface were transferred to an acrylic sheet to produce a nanostructure.

Uniformity of the minute concavities and convexities on the surface of the thus produced nanostructure was evaluated with the following criteria. The results are shown in Table 1.

The determination criteria were as follows. Good: no seam is visually recognized, Moderate: a seam is barely visually recognized, and Bad: a seam is visually recognized.

It can be seen from Table 1 that no seam is visually recognized and the level of uniformity of the minute concavities and convexities of the nanostructure is high when the pulse duty is less than 50% (Examples 1, 2, and 3) or the pulse duty is more than or equal to 50% but the distance between the centers of the latent images adjacent to each other across the laser light unirradiated portion set as the BA is smaller than or equal to 1.52 times the pitch of latent images in the exposure direction.

REFERENCE SIGNS LIST 1 nanostructure
2 substrate
3 structure
10 roll master exposure apparatus
11 roll master
12 resist layer
13 laser light source
14 electro optical modulator (EOM)
15 mirror
16 photodiode
17 optical modulation system (OM)
18 condenser lens
19 acoustic-optical modulator (AOM)
20 lens
21 formatter
22 driver
23 mirror
24 movable table
25 beam expander (BEX)
26 objective lens
27 spindle motor
28 turntable
L laser light
P1 pitch (in the exposure direction)
P2 diagonal pitch
T1, T2, T3, T4 track
Tp track pitch or feed pitch

The invention claimed is:

1. A nanostructure master used for manufacturing a nanostructure, the nanostructure master including surface concavities and convexities and an area without concavities and convexities that forms a seam in the nanostructure, so as to form the nanostructure comprising a number of tracks, each including arrangement of structures formed by the surface

TABLE 1

| | Exposure Direction Pitch P1 (nm) | Feed Pitch Tp (nm) | Diagonal Pitch P2 (nm) | Pulse Duty (%) | Distance Between Centers of Adjacent Latent Images Across BA (nm) | Ratio Between Distance Between Centers of Adjacent Latent Images Across BA And Exposure Direction Pitch | Type | Arrangement | Evaluation |
|---|---|---|---|---|---|---|---|---|---|
| Example 1 | 250 | 216 | 250 | 20 | 250 | 1 | A | Hexagonal Lattice | Good |
| Example 2 | 270 | 169 | 216 | 40 | 270 | 1 | B | Quasi-Hexagonal Lattice | Good |
| Example 3 | 270 | 169 | 216 | 40 | 365 | 1.35 | B | Quasi-Hexagonal Lattice | Good |
| Example 4 | 282 | 141 | 200 | 60 | 429 | 1.52 | D | Tetragonal Lattice | Good |
| Comparative Example 1 | 282 | 141 | 200 | 60 | 482 | 1.71 | C | Tetragonal Lattice | Moderate |
| Comparative Example 2 | 282 | 141 | 200 | 60 | 632 | 2.24 | C | Tetragonal Lattice | Bad | concavities and convexities on a surface of a substrate with a predetermined pitch, wherein every track includes a portion in which there are no additional structures continuously formed within the predetermined pitch so as to form the seam across a plurality of tracks, wherein the portion includes a distance between centers of the structures adjacent to each other across the seam, the distance between the centers of the structures adjacent to each other across the seam or a length of the seam is determined so as to prevent visual recognition of the seam, the distance between the centers of the structures adjacent to each other across the seam is set to be:

(i) 1 to 1.52 times the predetermined pitch, or (ii) greater than 1.52 times the pitch when the length of the seam continuously formed across a plurality if tracks is set at 50 µm or less, and the adjacent structures of different tracks are arranged in a staggered manner.

2. The nanostructure master according to claim 1, wherein the nanostructure master is a roll master.

\* \* \* \* \*